(12) United States Patent
Kao et al.

(10) Patent No.: US 7,768,288 B2
(45) Date of Patent: Aug. 3, 2010

(54) DETECTION DEVICE

(75) Inventors: Yung-Shun Kao, Taipei Hsien (TW);
Chih-Ming Lai, Taipei Hsien (TW)

(73) Assignee: Giga-Byte Technology Co., Ltd., Taipei Hsien (TW)

( * ) Notice: Subject to any disclaimer, the term of this patent is extended or adjusted under 35 U.S.C. 154(b) by 787 days.

(21) Appl. No.: 11/654,558

(22) Filed: Jan. 18, 2007

(65) Prior Publication Data
US 2008/0155312 A1    Jun. 26, 2008

(30) Foreign Application Priority Data
Oct. 12, 2006    (TW) .............................. 95137526 A

(51) Int. Cl.
*G01R 31/02*    (2006.01)
(52) U.S. Cl. ...................................................... 324/763
(58) Field of Classification Search ................ 324/760, 324/754, 761–762, 765, 158.1; 257/48; 438/14–16
See application file for complete search history.

(56) References Cited

U.S. PATENT DOCUMENTS 6,885,213 B2 * 4/2005 Sunter ........................ 324/765
7,129,730 B2 * 10/2006 Liu et al. ..................... 324/758

FOREIGN PATENT DOCUMENTS

| JP | 1-160377 | 11/1989 |
| JP | 4077834 A | 3/1992 |
| JP | 6095908 A | 4/1994 |

* cited by examiner

*Primary Examiner*—Ha Tran T Nguyen
*Assistant Examiner*—Tung X. Nguyen
(74) *Attorney, Agent, or Firm*—Birch, Stewart, Kolasch & Birch, LLP

(57) ABSTRACT

A detection device for a chip. A faulty chip is detected from a plurality of chips via the detection device. The chips are installed on a printed circuit board. The detection device electrically connected to the printed circuit board comprises a updateable chip and a substitute printed circuit board. The substitute printed circuit board is electrically connected to the updateable chip and comprises a plurality of pins disposed on two sides thereof for connecting to each chip.

18 Claims, 7 Drawing Sheets

DETECTION DEVICE

BACKGROUND OF THE INVENTION

1. Field of the Invention

The invention relates to a detection device.

2. Description of the Related Art

When a chip on a printed circuit board malfunctions, typically, all the chips are removed from the printed circuit board and tested individually to detect the faulty chip. If a detector discovers the damaged information in a chip, the chip is updated and replaced on the printed circuit board. If a detector discovers a non-functioning chip, the faulty chip is exchanged for a new one. Thus, the printed circuit board again operates normally. Conventional detection steps are inefficient, however, because they do not give the exact position of the faulty chip, thus, a detector must first find an abnormal area on the printed circuit board and all the chips are removed from the abnormal for individual detection.

BRIEF SUMMARY OF INVENTION

The invention provides a detection device for detecting chips on a printed circuit board. The detection device comprises an updateable chip and substitute printed circuit board electrically connected to the updateable chip. The substitute printed circuit board comprises a plurality of pins and the updateable chip comprises a plurality of pins. The pins of the substitute printed circuit board correspond and electrically connect to the pins of the updateable chip. Thus, the detection device is electrically connected to a faulty chip on the printed circuit board. Moreover, the updateable chip comprises a hold pin (also referred to as a select pin). Supplying high voltage or low voltage to the hold pin enables or disables the chip on the printed circuit board. Thus, the faulty chip electrically connected to the detection device is disabled via the detection device, the updateable chip substitutes for the faulty chip allowing operation without-requiring removal of the faulty chip: Examples of double BIOS and single BIOS are described in the following.

DOUBLE BIOS:

When any BIOS data is wrong, other BIOS copies correct the BIOS data with incorrect data. If two BIOS data are incorrect, the detection device restores the BIOS. The two BIOS comprise BIOS-1 and BIOS-2. The detection device comprises BIOS-N. The detection device is electrically connected to BIOS-1 for disabling BIOS-1. For example, a computer comprises a motherboard. The computer starts via BIOS-N. The motherboard copies BIOS-N data to BIOS-2. After updating, the detection device is removed from the BIOS-2. The computer starts again, the BIOS-2 data is copied to the BIOS-1 via the motherboard.

SINGLE BIOS:

Single BIOS comprises BIOS-F. The detection device comprises BIOS-N. The detection device is electrically connected to BIOS-F for disabling BIOS-F. The computer starts via BIOS-N, and execute software to update BIOS. Before updating BIOS-F, enable BIOS-F and disable BIOS-N. Then, the correct BIOS data in the storage is copied to the BIOS-F.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
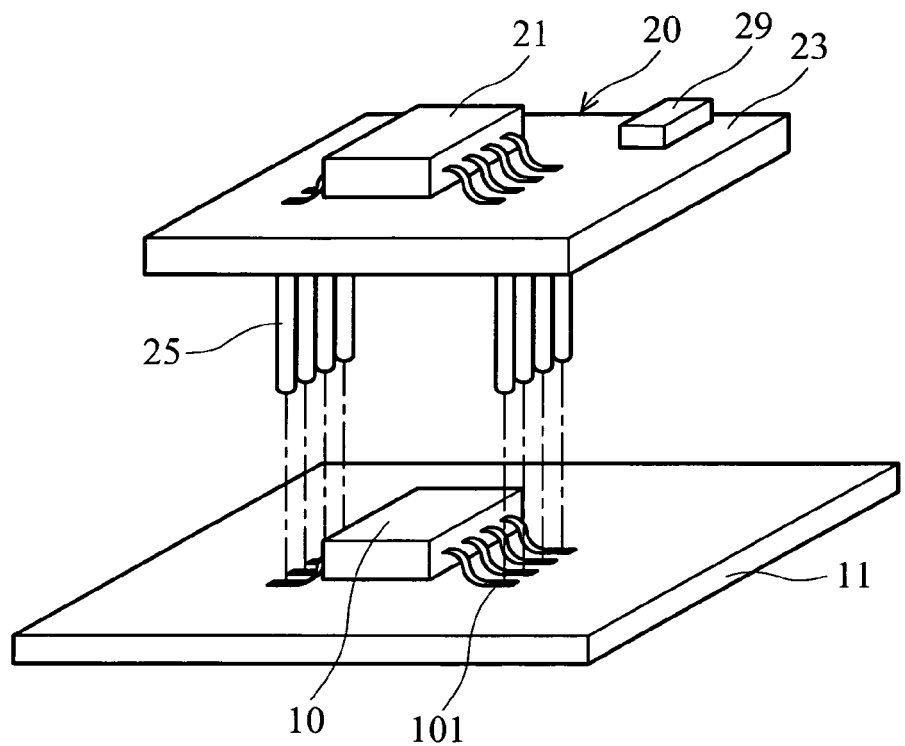
FIGS. 1A-1B are schematic views of the detection device of an embodiment of the invention and the printed circuit board.

Referring to FIG. 1A, a chip 10 is installed on and electrically connected to a printed circuit board 11. The invention provides a detection device 20 for detecting the chip 10 on the printed circuit board 11. If the chip 10 is faulty, an updateable chip 21 of the detection device 20 substitutes for the faulty chip 10. Thus, the printed circuit board 11 works temporarily. Finally, the data of the faulty chip 10 is updated. If the faulty chip 10 is not restored, the faulty chip 10 is removed so that a new chip can be installed. For example, a computer may not start because the BIOS chip on a motherboard is faulty. When the computer does not start, the detection device 20 is electrically connected to the BIOS chip to disable the BIOS chip. Because the BIOS chip is disabled, the motherboard reads the data of the updateable chip 21, thus, the computer starts. After starting the computer, the BIOS is enabled and the detection device 20 is removed from the BIOS chip. The data of BIOS chip is updated via software. If the BIOS chip is not restored, the BIOS chip is removed so that a new one may be installed.

Figure 1B:
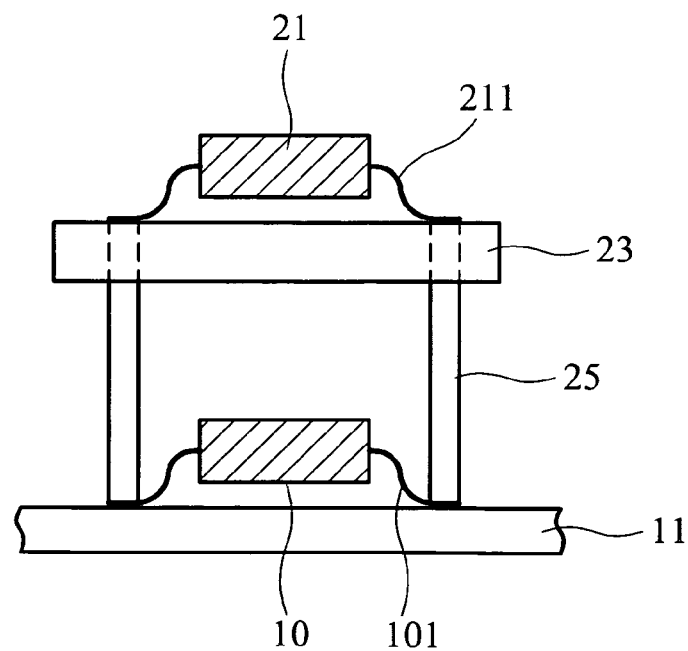

The detection device 20 comprises a updateable chip 21, a substitute printed circuit board 23 electrically connected to the updateable chip 21. Referring to FIG. 1B, the substitute printed circuit board 23 comprises a plurality of pins 25 and the updateable chip 21 comprises a plurality of pins 211. The pins 25 of the substitute printed circuit board 23 correspond and electrically connect to the pins 211 of the updateable chip 21. The chip 10 comprises a plurality of pins 101. When the detection device 20 is electrically connected to the chip 10, the pins 25 are electrically connected to the pins 101 of the chip 10. The substitute printed circuit board 23 comprises a switch 29 (shown in FIG. 1A, and omitted in other Figures) for enabling or disabling the chip 10 and the updateable chip 21. When the detection device 20 detects the chip 10, the switch 29 disables the chip 10 and enables the updateable chip 21. The updateable chip 21 substitutes for the chip 10, thus, the printed circuit board 11 works temporarily. When the chip 10 is disabled via the switch 29, the updateable chip 21 is simultaneously enabled via the switch 29. When the chip 10 is enabled via the switch 29, the updateable chip 21 is simultaneously disabled via the switch 29. The switch 29' is extensively applied in digital logical circuits, thus, description thereof is omitted.

Figure 2A:
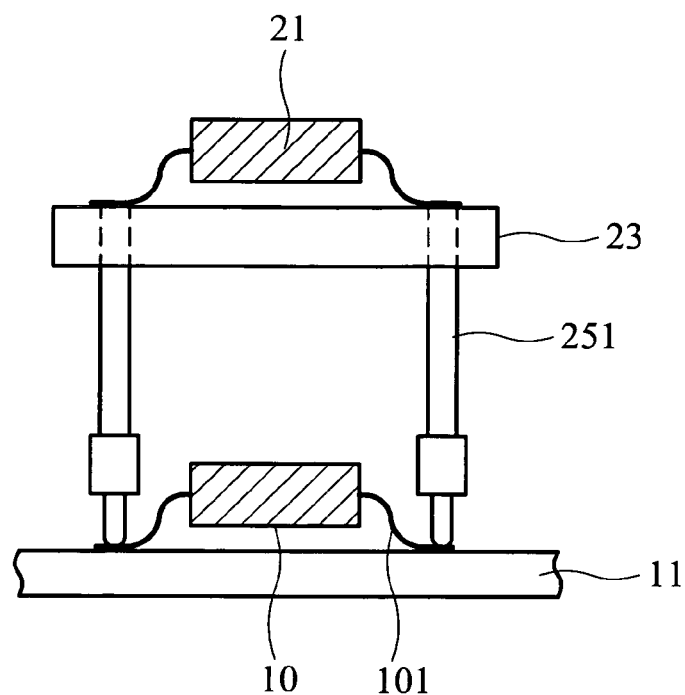
FIGS. 2A-2B are schematic views of the detection device of another embodiment of the invention and the printed circuit board.
Figure 2B:
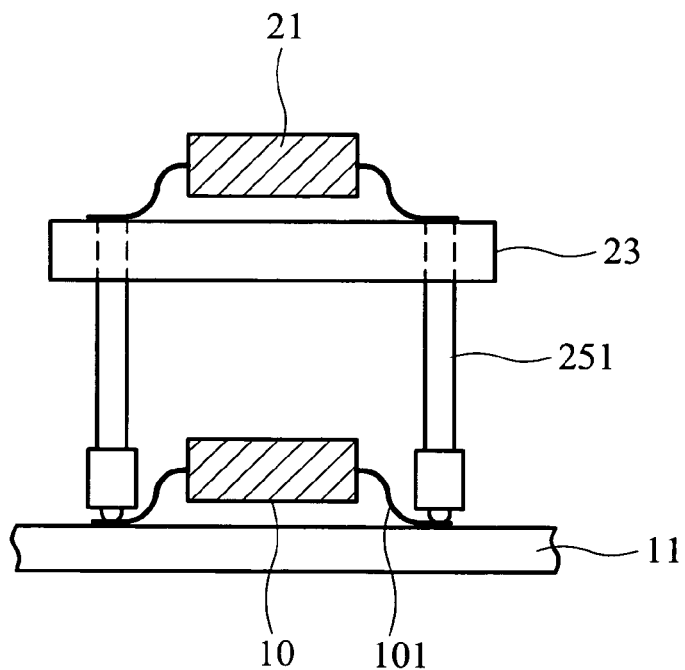
Figure 3A:
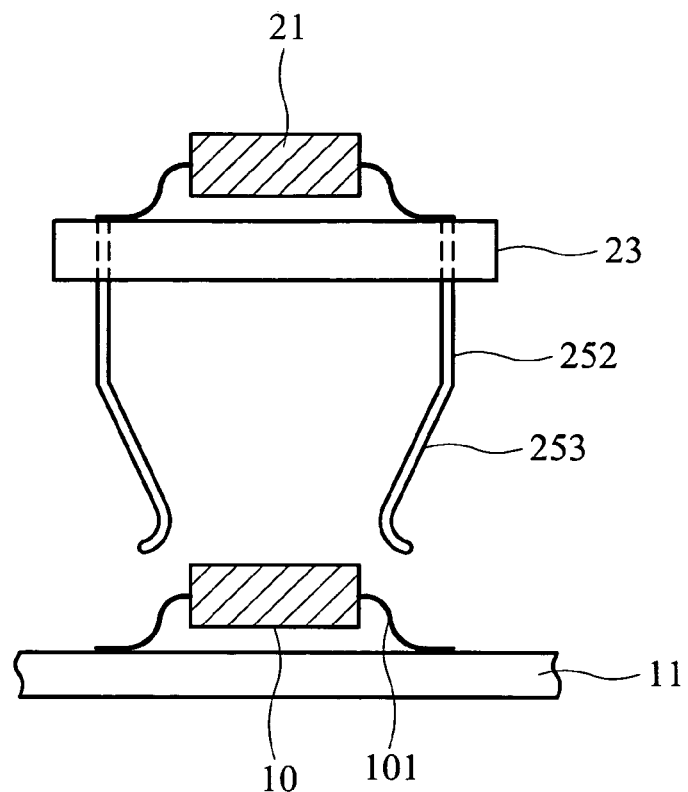
FIGS. 3A-3B are schematic views of the detection device of another embodiment of the invention and the printed circuit board.
Figure 3B:
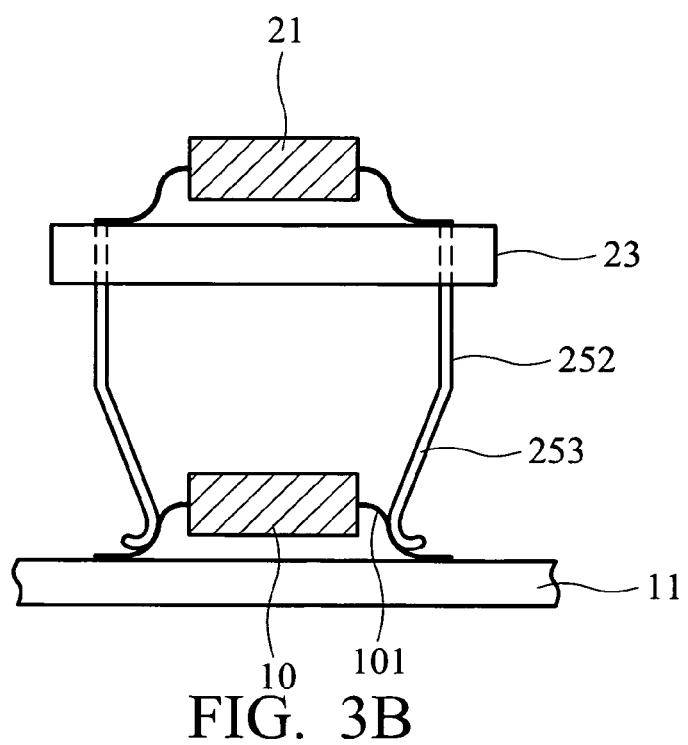

The pins 101 of the chip 10 are not at the same level. Thus, the pins 25 comprise pogo pin 251 (shown in FIG. 2A) to prevent inadequate connection. When the detection device 20 is installed on the chip 10, the detection device 20 is pressed down lightly as shown in FIG. 2B. Accordingly, the pins 101 of the chip 10 are stably and electrically connected to the detection device 20. Referring to FIG. 3A, the detection device 20 comprises a plurality of flexible pins 252 electrically connected to the pins 101 of the chip 10. When the detection device 20 is installed on the chip 10, the detection device 20 is lightly pressed down. Accordingly, the pins 101 of the chip 10 are stably and electrically connected to the pins 25. Each flexible pin 252 comprises a horizontally movable free end 253 for ensuring stable connection between the detection device 20 and the pins 101 of the chip 10.

Figure 4A:
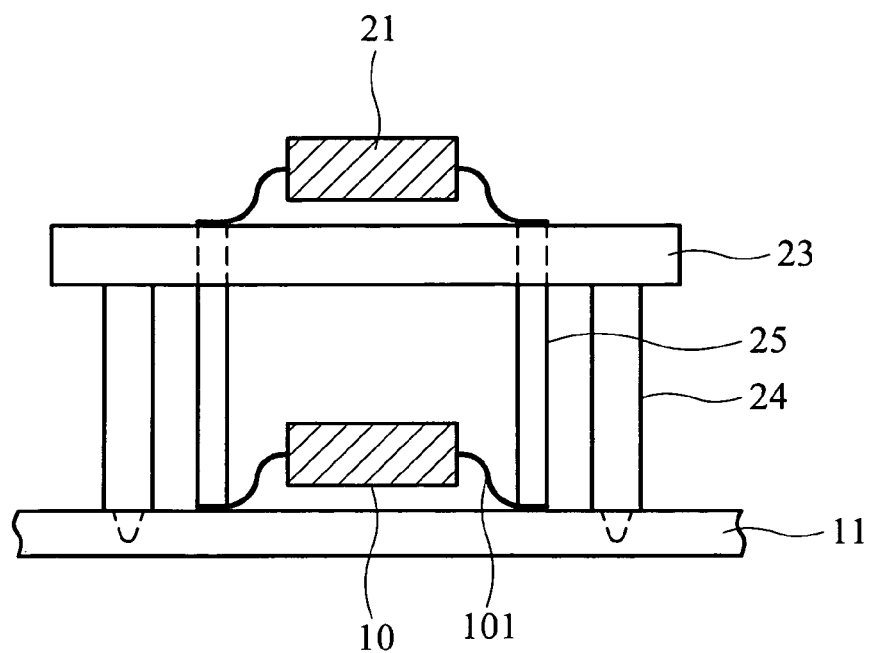
FIGS. 4A-4B are schematic views showing the detection device of an embodiment of the invention to connect to the printed circuit board.
Figure 4B:
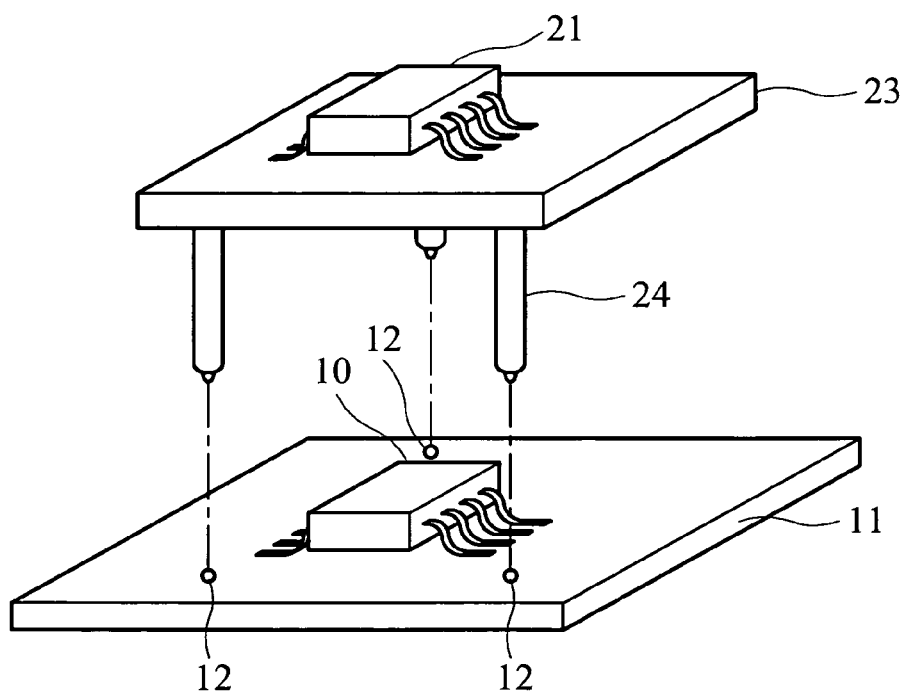

Referring to FIG. 4A, the substitute printed circuit board 23 comprises at least a fixing portion 24 for preventing disconnection, slanting or movement of the detection device 20. The printed circuit board 11 comprises a hole 12 corresponding to the fixing portion 24. When the detection device 20 is installed on the chip 10, the detection device 20 is stably connected to the pins 101 of the chip 10 via the engagement of the fixing portion 24 and the hole 12. Referring to FIG. 4B (pins 25 are omitted), each pin 101 of the chip 10 transmits different data. The substitute printed circuit board 23 comprises three fixing portions 24 to ensure that the updateable chip 21 is inserted in a correct direction for avoiding the incorrect connection with the chip 10.

Figure 5A:
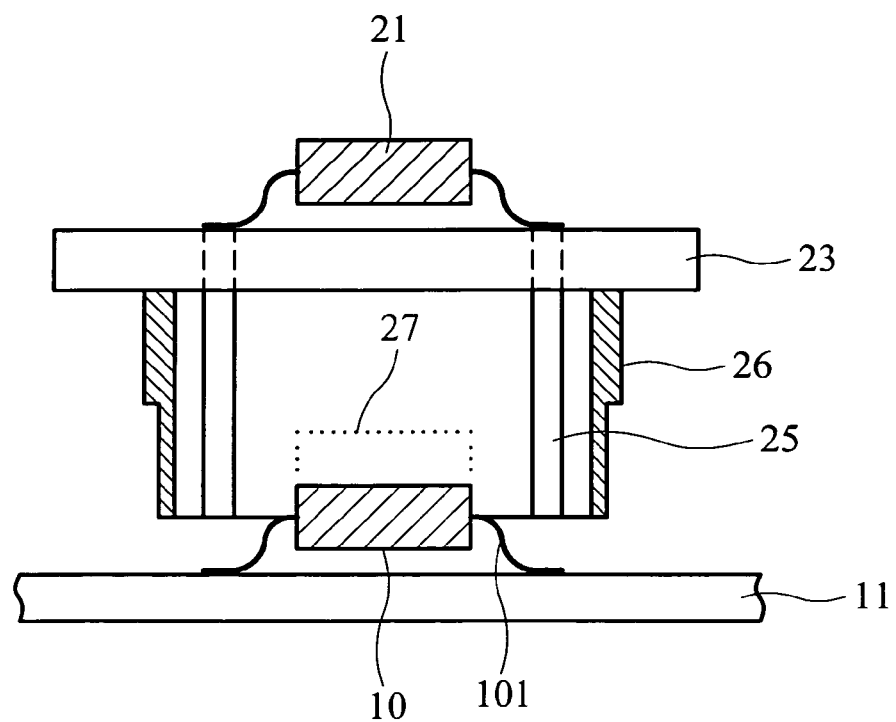
FIGS. 5A-5C are schematic views showing the detection device of another embodiment of the invention to connect to the printed circuit board.
Figure 5B:
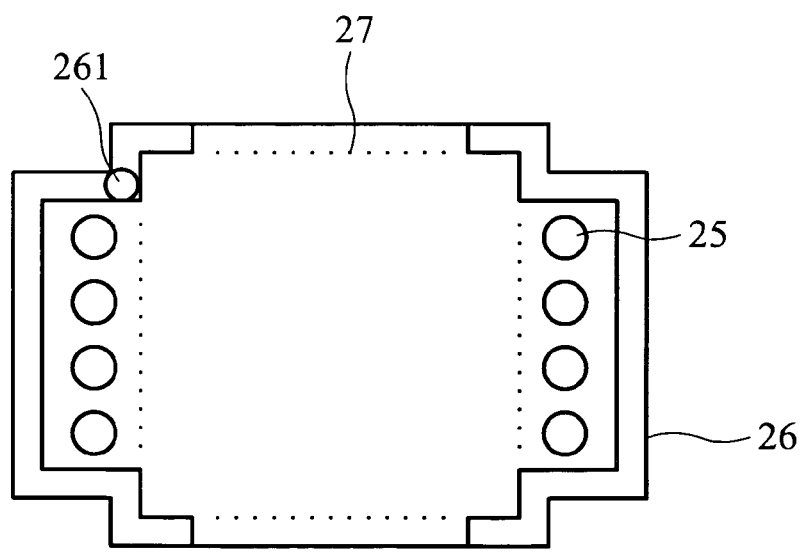
Figure 5C:
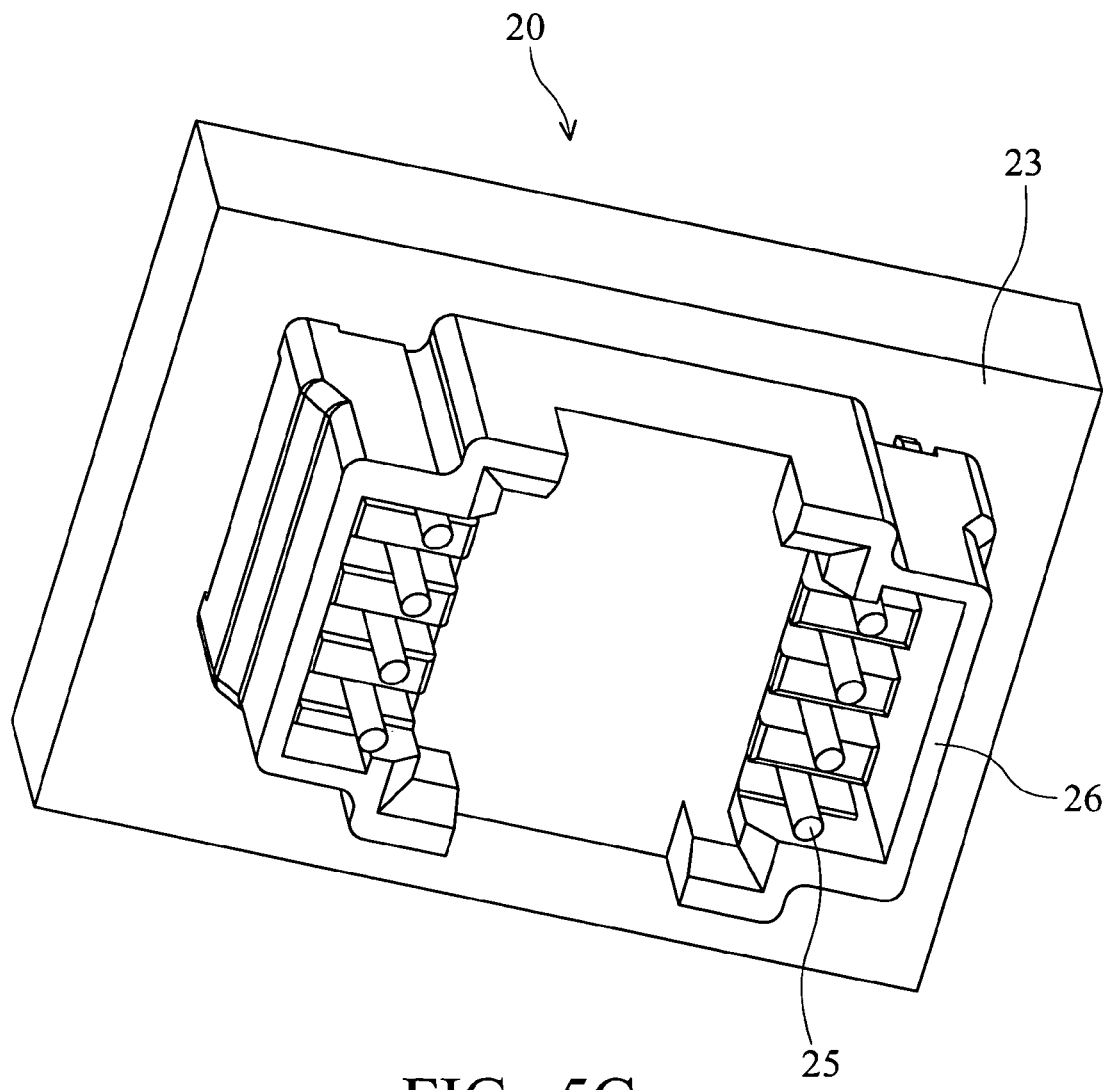

FIG. 5A shows another embodiment of the invention. The substitute printed circuit board 23 comprises a shell 26 (FIG. 5A shows the crosscut of shell 26) disposed under the substitute printed circuit board 23 and around the pins 25 for protecting the detection device 20. The detection device 20 is fixed on the chip 10 via the shell 26. Referring to FIGS. 5B and 5C, the shell 26 comprises a space 27 for containing the chip 10. The space 27 prevents disconnection, slanting or movement of the detection device 20. The shell 26 further comprises a fixing element 261 and the printed circuit board 11 comprises a hole for avoiding the incorrect connection of the chip 10 and the substitute chip 21.

Figure 6:
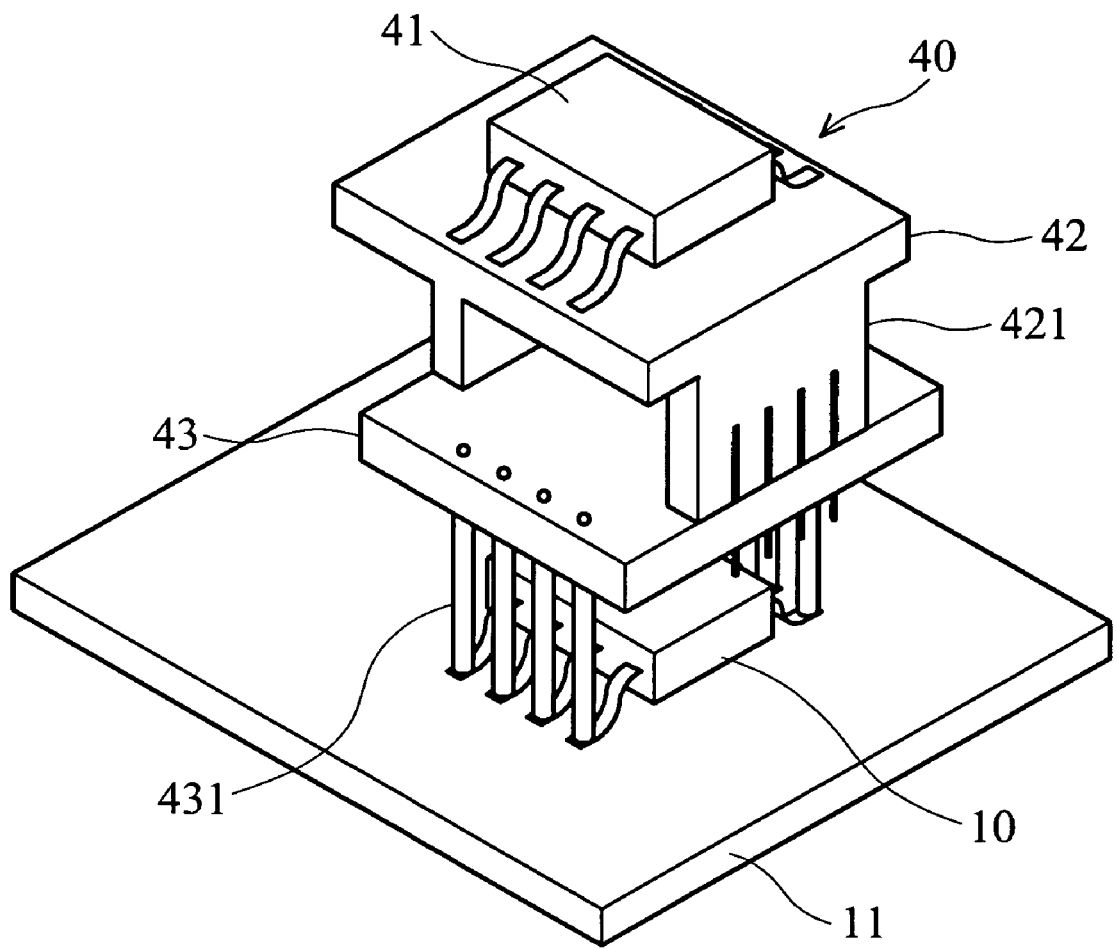
FIG. 6 is a schematic view of the detection device of another embodiment of the invention.

Referring to FIG. 6, the detection device 40 comprises an updateable chip 41, a connected printed circuit board 42 and a substitute printed circuit board 43. The connected printed circuit board 42 comprises a-plurality of pins 421. The connected printed circuit board 42 is electrically connected to the substitute printed circuit board 43 via the pins 421. The updateable chip 41 is electrically connected to the pins 421: The substitute printed circuit board 43 comprises a plurality of pins 431 disposed on both sides of the substitute printed circuit board 43 and electrically connected to the pins 421 connected printed circuit board 42. When the detection device 40 is installed on the chip 10, the substitute printed circuit board 43 is electrically connected to the chip 10 via the pins 431. The shape of the pins 431 may be similar to FIGS. 2A-3B. The updateable chip 43 may be similar to FIGS. 4A-5C.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A detection device, wherein the detection device detects a chip electrically connected to a printed circuit board, comprising:
   an updateable chip, comprising a plurality of pins;
   a substitute printed circuit board, electrically connected to the updateable chip, comprising a plurality of pins disposed on two sides of the substitute printed circuit board and electrically connected to the pins of the updateable chip; and
   a switch connected to the chip and the updateable chip for controlling the chip and the updateable chip,
   wherein when the chip is faulty, the updateable chip substitutes for the faulty chip.

2. The detection device as claimed in claim 1, wherein the substitute printed circuit board comprises at least one fixing portion to fix the printed circuit board.

3. The detection device as claimed in claim 2, wherein the substitute printed circuit board comprises three fixing portions.

4. The detection device as claimed in claim 1, wherein the substitute printed circuit board comprises a shell for protecting the detection device.

5. The detection device as claimed in claim 4, wherein the shell comprises a fixing element.

6. The detection device as claimed in claim 4, wherein the shell comprises a space for containing the chip.

7. The detection device as claimed in claim 1, wherein the pins of the substitute printed circuit board are pogo pin.

8. The detection device as claimed in claim 1, wherein the pins of the substitute printed circuit board are flexible.

9. The detection device as claimed in claim 8, wherein each flexible pin comprises a free end, the free end moves horizontally.

10. A detection device, wherein the detection device detects a plurality of chips electrically connected to a printed circuit board, comprising:
    an updateable chip comprising a plurality of pins;
    a connected printed circuit board, electrically connected to the updateable chip, comprising a plurality of pins;
    a substitute printed circuit board, electrically connected to the updateable chip and the connected printed circuit board, comprising a plurality of pins disposed on two sides of the substitute printed circuit board and electrically connected to the pins of the updateable chip; and
    a switch connected to the chip and the updateable chip for controlling the chip and the updateable chip,
    wherein when the chip is faulty, the updateable chip substitutes for the faulty chip.

11. The detection device as claimed in claim 10, wherein the substitute printed circuit board comprises at least one fixing portion to fix the printed circuit board.

12. The detection device as claimed in claim 11, wherein the substitute printed circuit board comprises three fixing portions.

13. The detection device as claimed in claim 10, wherein the substitute printed circuit board comprises a shell for protecting the detection device.

14. The detection device as claimed in claim 13, wherein the shell comprises a fixing element.

15. The detection device as claimed in claim 13, wherein the shell comprises a space for containing the chip.

16. The detection device as claimed in claim 10, wherein the pins of the substitute printed circuit board are pogo pin.

17. The detection device as claimed in claim 10, wherein the pins of the substitute printed circuit board are flexible.

18. The detection device as claimed in claim 17, wherein each flexible pin comprises a free end, the free end moves horizontally.

* * * * *